(12) United States Patent
Grundmann

(10) Patent No.: US 7,299,425 B2
(45) Date of Patent: Nov. 20, 2007

(54) METHOD AND APPARATUS TO CREATE BYPASS LOGIC IN A DIGITAL CIRCUIT DESIGN

(75) Inventor: William J. Grundmann, Westborough, MA (US)

(73) Assignee: Intel Corporation, Santa Clara, CA (US)

( * ) Notice: Subject to any disclaimer, the term of this patent is extended or adjusted under 35 U.S.C. 154(b) by 129 days.

(21) Appl. No.: 10/606,868

(22) Filed: Jun. 26, 2003

(65) Prior Publication Data

US 2004/0268273 A1 Dec. 30, 2004

(51) Int. Cl.
*G06F 17/50* (2006.01)

(52) U.S. Cl. .............................. 716/1; 716/2
(58) Field of Classification Search ............... 716/1–3
See application file for complete search history.

(56) References Cited

U.S. PATENT DOCUMENTS 5,301,153 A * 4/1994 Johnson ..................... 365/200
6,212,629 B1 * 4/2001 McFarland et al. ......... 712/241
6,219,819 B1 * 4/2001 Vashi et al. ..................... 716/3
6,625,788 B1 * 9/2003 Vashi et al. ..................... 716/6

\* cited by examiner

*Primary Examiner*—Stacy Whitmore
(74) *Attorney, Agent, or Firm*—Schwegman, Lundberg & Woessner, P.A.

(57) ABSTRACT

A method and apparatus to create bypass logic in a digital circuit design comprising coupling a first latency delay unit to a data input of the conditional state element (e.g., a flip-flop). Coupling a second latency delay unit to an enable input of the conditional state element. Coupling a first input of a multiplexer to an output of the conditional state element. Coupling a second input of the multiplexer to the data input of the conditional state element; and coupling a select line of the multiplexer to the enable input of the conditional state element to form a logically redundant element. Replacing the conditional state element in a feedback loop of a finite state machine with the logically redundant element and manipulating latency delay units to create bypass logic in the digital circuit design.

17 Claims, 7 Drawing Sheets

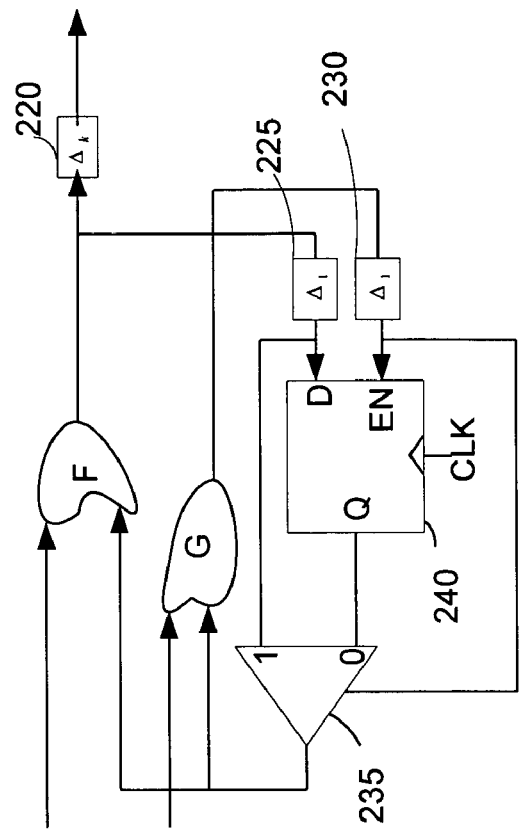
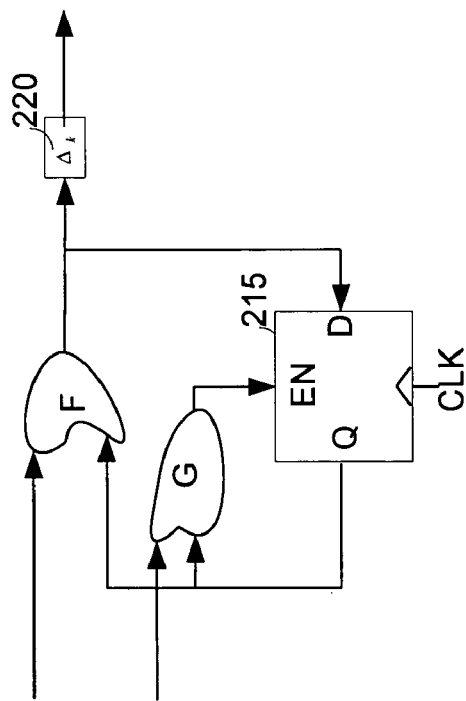
Fig. 2B
Fig. 2A

METHOD AND APPARATUS TO CREATE BYPASS LOGIC IN A DIGITAL CIRCUIT DESIGN

BACKGROUND

1. Field of the Invention

The present invention is related to the field of circuit design. In particular, the present invention is related to method and apparatus to create bypass logic in a digital circuit design.

2. Description of the Related Art

The use of pipeline stages in microprocessor design is well known by one having ordinary skill in the art. Pipelining provides for the subdivision of circuit delays across multiple cycles. Pipelines stages have state or memory circuit elements that hold data from a previous pipeline stage's output and makes that data available for input of the next pipeline stage's logical operations. These state or memory circuit elements are constructed many different ways, but are sequentially clocked either unconditionally or conditionally. Some of the conditionally clocked memory elements require multiple pipeline stages to just implement their function. Sometimes data needed by a logical operation in one pipeline stage of logic may be dependent upon the results of a conditional memory pipeline element in another stage of the same or different pipeline. Modern microprocessors provide bypass logic to enable the data to be obtained directly from another pipeline stage, rather than waiting the full pipeline time for it to be written to the final conditional memory element (destination register) and then obtaining the data. Thus, bypass logic bypasses the waiting of the data to actually get to the destination register and the reading of the data from the destination register, and therefore decreases the amount of time for the operation and increases a microprocessor's throughput.

Bypass logic is used to keep a finite-state-machine's (FSM) total latency loop the same as originally described even though the implementation of some of the latencies within the loop take more cycles. These additional latencies are used to ease the implementation of constructing those circuits. Implementation of bypass logic is only useful for design consideration whenever the pipeline stage is conditionally updated or clocked and when the delay of the function is longer than the delay of an implemented logical multiplexer. These conditional pipeline stages typically are register files or other deterministic memory elements (registers). A simple but valid common abstraction of all of these elements may be a common conditionally enabled flip-flop.

Microprocessor designers create logical models, using high-level logic descriptions, to represent the design's behavior. These models are used for the logical validation of the whole design and by the circuit implementation of the microprocessor to constructs the completed final silicon. Implementation diverges from the high-level model details as long as CAD technologies can prove behavioral equivalence. In order to incorporate a bypass logic circuit in a circuit's design, conventionally, the design's high-level logic description includes detailed instructions for implementing the bypass logic circuitry. This is necessary because the methods and computer aided design (CAD) tools do not guarantee proofs for an implementation using a bypass logic circuit without a detailed description of the logic bypass circuit also in the high-level model. Even with a detailed description, the bypass logic may be implemented in other than the optimum location in the circuit's design, and may hinder the circuit's portability and scalability.

BRIEF SUMMARY OF THE DRAWINGS

Example embodiments of the present invention are illustrated in the accompanying drawings. The accompanying drawings, however, do not limit the scope of the present invention. Similar references in the drawings indicate similar elements.

FIG. 2A-2B illustrates a finite state machine transformed using the logically redundant element of FIG. 1E according to one embodiment of the invention.

DETAILED DESCRIPTION

Described is a method and apparatus to create bypass logic in a digital circuit design. The method and apparatus comprises coupling a first latency delay unit to a data input of a conditional state element (e.g., a flip-flop, a register file, a deterministic memory etc.). Coupling a second latency delay unit to an enable input of the conditional state element. Coupling a first input of a multiplexer to an output of the conditional state element. Coupling a second input of the multiplexer to the data input of the conditional state element; and coupling a select line of the multiplexer to the enable input of the conditional state element to form a logically redundant element. The method further comprises replacing the conditional state element in a feedback loop of a finite state machine with the logically redundant element. The finite state machine comprises an F function and a G function, coupled to the logically redundant element. Replacing the conditional state element in the finite state machine with the logically redundant element comprises coupling the first latency delay unit to an output of the F function. Coupling the second latency delay unit to an output of the G function; and coupling the multiplexer output to an input of the F function, and to an input of the G function.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art to effect such feature, structure, or characteristic in connection with other embodiments whether or not explicitly described. Parts of the description are presented using terminology commonly employed by those of ordinary skill in the art to convey the substance of their work to others of ordinary skill in the art.

In the following description and claims, the terms "coupled" and "connected", along with derivatives such as "communicatively coupled" may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct physical contact with each other, but still co-operate or interact with each other.

Figure 1A:
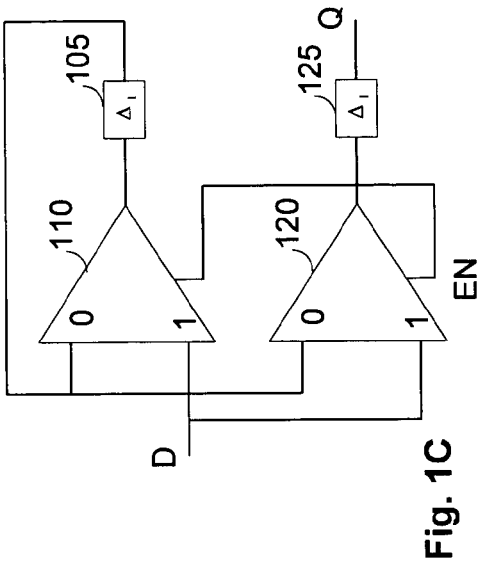
FIG. 1A-1E illustrates a transformation of a conditional state element to a logically redundant element according to one embodiment of the invention.

FIG. 1A-1E illustrates a transformation of a conditional state element to a logically redundant element according to one embodiment of the invention. In order to create bypass logic in a digital circuit design, a conditional state element e.g., a flip-flop, a latch, a register file, a cache memory cell etc. is identified and transformed into a logically redundant element as illustrated in FIGS. 1A-1E. FIG. 1A illustrates a D-type flip-flop 100 having a D input, enable input (EN), a clock input, and a Q output.

Figure 1B:
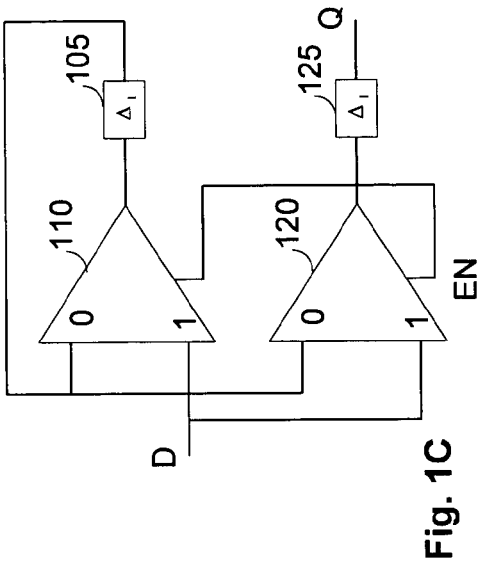

As FIG. 1B illustrates, the enabled D flip-flop 100 is replaced by logically equivalent elements comprising a multiplexer 110 coupled to a latency delay unit 105. A latency delay unit is a mathematical entity, well known by one having ordinary skill in the art, which may be manipulated and transformed into a latency delay unit having other latency delays using certain rules. The resulting latency delay unit may have latency delays of any numerical value. Referring to FIG. 1B, the output of multiplexer 110 is coupled to the input of latency delay unit 105, and the output of the latency delay unit 105 is coupled to the 0 input of the multiplexer 110. The output of the latency delay unit 105 corresponds with the Q output of flip-flop 100. The 1 input of the multiplexer 110 corresponds with the D input of flip-flop 100, and the select input of the multiplexer 110 corresponds with the EN input of flip-flop 100.

Figure 1C:
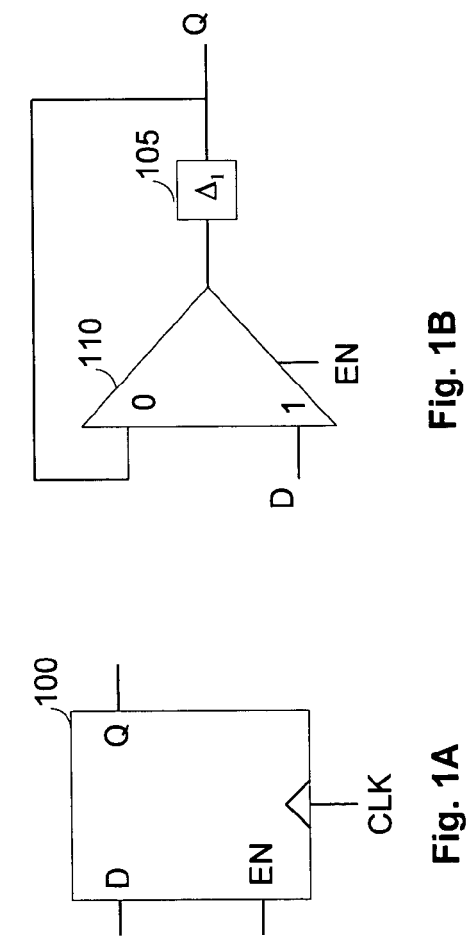

FIG. 1C comprises coupling a second multiplexer 120, with a corresponding second latency delay unit 125, to multiplexer 110. In particular, as illustrated in FIG. 1C the output of multiplexer 120 is coupled to the input of a second latency delay unit 125. The EN input of multiplexer 120 is coupled to the EN input of multiplexer 110. The 0 input of multiplexer 120 is coupled to the 0 input of multiplexer 110 and to the output of the first latency delay unit 105. The 1 input of multiplexer 120 is coupled to the 1 input of multiplexer 110, and to a line representing the D input of flip-flop 100. One having ordinary skill in the art will appreciate that the output Q of flip-flop 100 is the output of the second latency delay unit 125. FIG. 1B and FIG. 1C are logically equivalent.

Figure 1D:
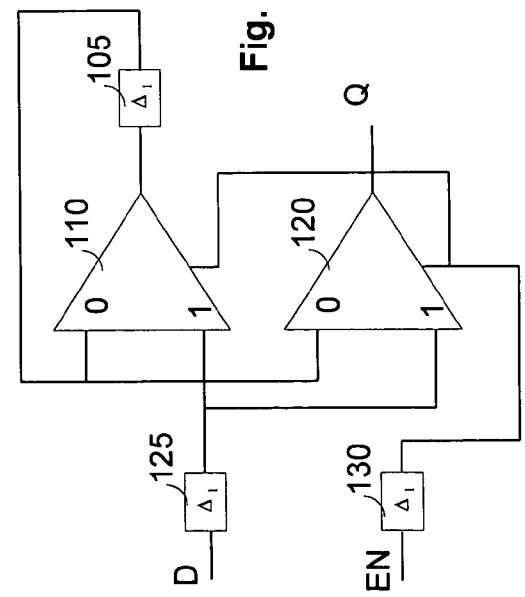

FIG. 1D illustrates moving the latency delay unit 125 of FIG. 1C from the output of multiplexer 120 to the 1 input of multiplexers 110 and 120. The movement of the latency delay unit 125 from the output of multiplexer 120 causes a latency delay unit 130 to be added to the select inputs (EN) of the multiplexers 110 and 120. In one embodiment of the invention this operation is called the retime backward operation, well known to one having ordinary skill in the art. FIG. 1D is logically equivalent to FIG. 1C.

Figure 1E:
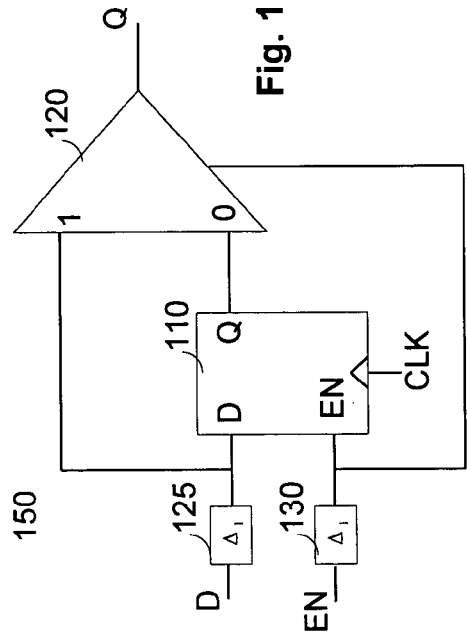

FIG. 1E illustrates replacing multiplexer 110 and the latency delay unit 105 coupled to the output of multiplexer 110 with flip-flop 110 to form logically redundant element 150. As illustrated in FIG. 1E logically redundant element 150 comprises coupling latency delay unit 125 to the data input (D) of flip-flop 110. Coupling the second latency delay unit 130 to an enable input (EN) of the flip-flop 110. Coupling the 0 input of multiplexer 120 to the output Q of the flip-flop 110. Coupling the 1 input of the multiplexer 120 to the D input of the flip-flop 110 and to the output of the latency delay unit 125, and coupling the select line of the multiplexer 120 to the enable input (EN) of the flip-flop 110. The coupling of multiplexer 110 and latency element 105 comprise the circuit of FIG. 1B which is equivalent to the flip-flop 100 of FIG. 1A.

FIG. 2A-2B illustrates a finite state machine transformed using the logically redundant element of FIG. 1E according to one embodiment of the invention. As FIG. 2A illustrates, the finite state machine comprises two functions F and G coupled to flip-flop 215, said flip-flop 215 in the feedback loop of the F function. The F function determines the value to write to flip-flop 215. The G function determines when to write the value from the F function to the flip-flop 215. The output of the F function is coupled to the D input of flip-flop 215 and to the input of latency delay unit 220 having a latency delay of K units. The output of the G function is coupled to the EN input of flip-flop 215. The output Q of flip-flop 215 is coupled to an input of the G function and to an input of the F function.

In order to create bypass logic in the finite state machine, the flip-flop 215 is replaced by the logically redundant element 150 of FIG. 1E as illustrated in FIG. 2B. In particular, the output from the F function is coupled to a first latency delay unit 225 (having a one-unit delay) and to latency delay unit 220. The output from the G function is coupled to latency delay unit 230 (having a one-unit delay). The outputs from latency delay units 225 and 230 are coupled to the D input and to the EN input of flip-flop 240 respectively. The Q output of the flip-flop 240 is coupled to the 0 input of multiplexer 235, and the 1 input of multiplexer 235 is coupled to the D input of flip-flop 240. The output of the multiplexer 235 is coupled to an input of the G function and to an input of the F function as illustrated. Thus, flip-flop 240, latency delay units 225 and 230, and multiplexer 235 comprise the logically redundant element 150 described with respect to FIG. 1E.

Given the finite state machine of FIG. 2A, the data at the output of F at time t, F(t), is accessible at the input of F after a latency delay of 1 unit. Thus, the value F(t) is available at the input of F, if the flip-flop 215 is enabled, after (t−1) units of time. In order to add bypass logic, FIG. 2B is modified as illustrated in FIGS. 3A-3B.

Figure 3B:
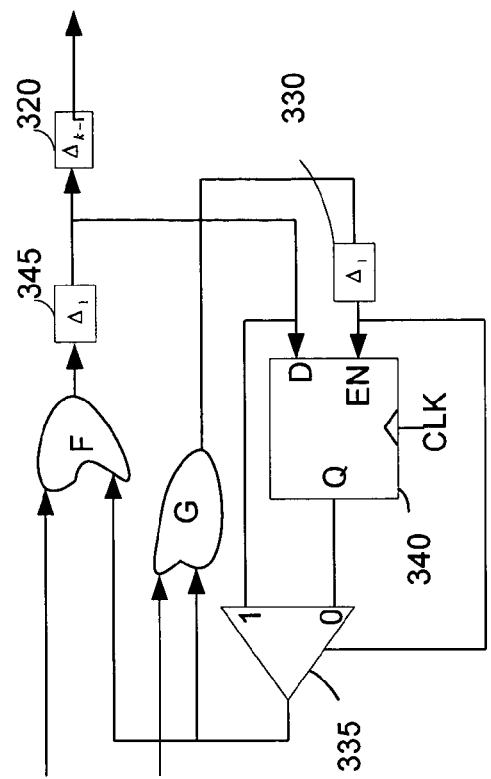
FIG. 3A-3B illustrates the finite state machine of FIG. 2A incorporating one pipeline stage according to one embodiment of the invention.
Figure 3A:
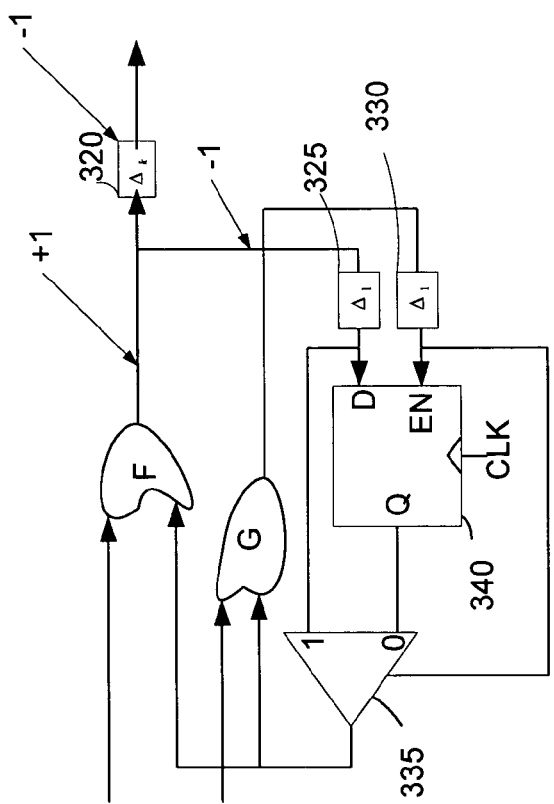

FIG. 3A-B illustrates the finite state machine of FIG. 2A incorporating one pipeline stage according to one embodiment of the invention. As illustrated in FIG. 3A, incorporating one pipeline state implies that the data F(t) at the output of function F of the finite state machine, will be available at the output of the flip-flop 340 after (t−2) units of time. However, because of the bypass logic of the one pipeline stage, the data is accessible at the input of function F after (t−1) units of time if flip-flop 340 is enabled. Thus, the flip-flop 340 is bypassed to maintain correct timing behavior.

To achieve this, the junction transformation rule, well known by one having ordinary skill in the art, is utilized. FIG. 3A represents the finite state machine of FIG. 2A wherein the flip-flop 215 is replaced by the logically redundant element 150 of FIG. 1. In addition, FIG. 3A illustrates the application of the junction transformation rule. Thus, as indicated in FIG. 3A, a latency delay unit having a latency delay of −1 unit is added to the latency delay unit $\Delta_k$ to form latency delay unit $\Delta_{k-1}$ having a latency delay of k−1 units. A latency delay unit having a latency delay of +1 unit and a latency delay unit having a latency delay of −1 unit are added to the output of the F function of the finite state machine, in the feedback loop between the F function and latency delay unit 325. After adding the aforementioned latency delay units the latency delay units are eliminated by reduction as illustrated in FIG. 3B. Thus, as FIG. 3B illustrates, latency delay unit 325 is eliminated, since the latency delay unit having a latency delay of −1 unit cancels the latency delay unit 325 having a latency delay of +1 unit. A new latency delay unit 345 is added to the output of function F to represent the +1 latency delay unit added in the feedback loop.

The modification of the circuit as illustrated in FIG. 3B allows the output of function F to be available at the input of function F after only t−1 units of time if the flip-flop 340 and hence the appropriate select line of multiplexer 335 is enabled. Thus, a simple substitution of the flip-flop in a finite state machine with the logically redundant element 150 described with respect to FIG. 1E, and a manipulation of delay elements as illustrated with respect to FIG. 3A-3B causes bypass logic to be automatically added to a digital logic design. In addition, the circuit with bypass logic is logically and temporally equivalent with the original digital logic circuit, eliminating the need to test the bypass circuit generated.

Figure 4A:
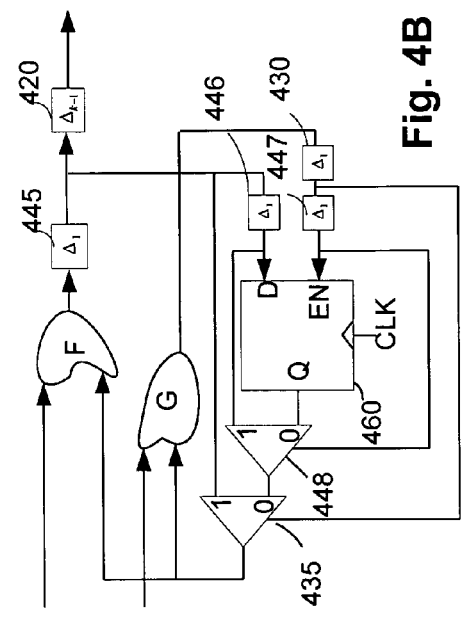
FIG. 4A-4E illustrates the finite state machine of FIG. 3B incorporating a second pipeline logic stage according to one embodiment of the invention.
Figure 4B:
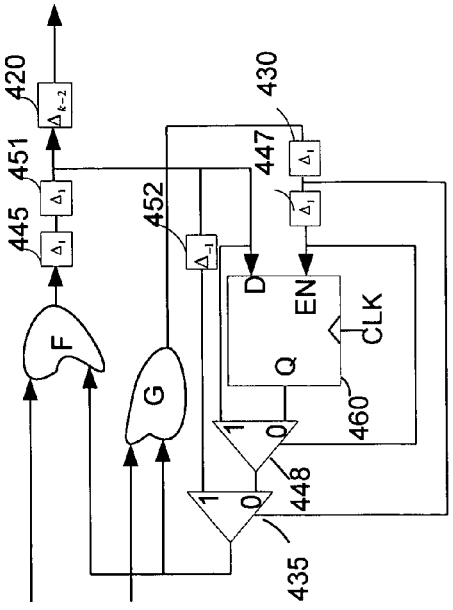
Figure 4C:
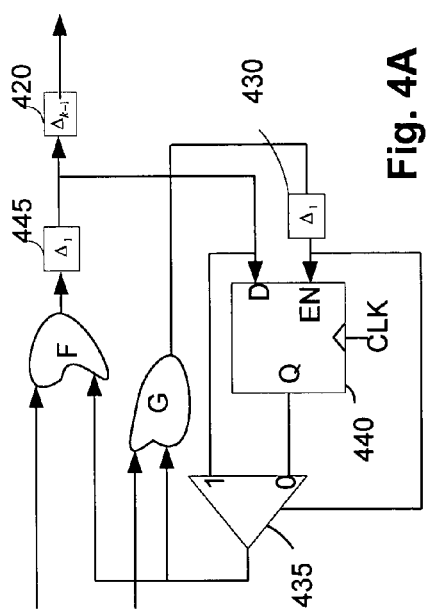

FIG. 4A-4E illustrates the finite state machine of FIG. 3B incorporating a second pipeline logic stage according to one embodiment of the invention. FIG. 4A illustrates the finite state machine of FIG. 3B, which incorporates one pipeline state. To add a second pipeline stage the flip-flop 440 of FIG. 4A is identified and is replaced by the logically redundant element 150 of FIG. 1E. FIG. 4B illustrates the flip-flop 440 of FIG. 4A replaced with the logically redundant element, said logically redundant element comprising flip-flop 460, latency delay unit 446 and 447, and multiplexer 448. Next as FIG. 4C illustrates, a latency delay unit having a latency delay of −1 unit is added to the existing latency delay unit 420 having a latency delay of k−1 units. To compensate for the addition of the −1 latency delay unit to latency delay unit 420, a latency delay unit having a latency delay of +1 unit is added to the branch comprising latency delay unit 445. Furthermore, a latency delay unit with a latency delay of −1 unit is added to the branch comprising latency delay unit 446 as illustrated in FIG. 4C (i.e., to the branch comprising the data input of the flip-flop 460).

Figure 4D:
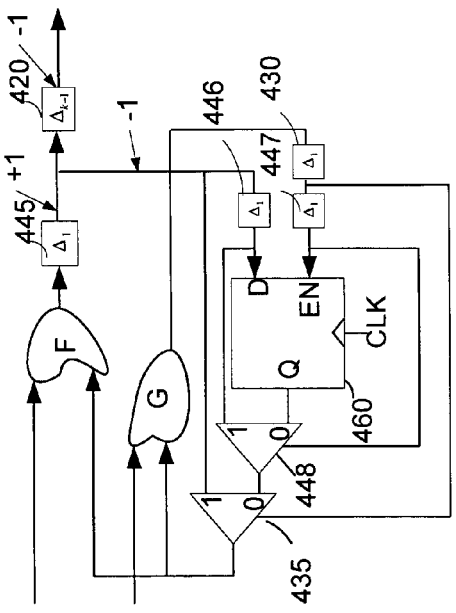

FIG. 4D illustrates reducing the latency delays. The latency delay units (446, and the −1 latency delay unit) on the branch comprising the D input of the flip-flop 460 are eliminated because the −1 latency delay unit cancels the existing latency delay unit 446 introduced by substituting flip-flop 440 with the logically redundant element. Due to the fork in the branch comprising the D input of the flip-flop 460, the latency delay unit 452 having a latency delay of −1 unit is added to the branch comprising the input of multiplexer 435.

Figure 4E:
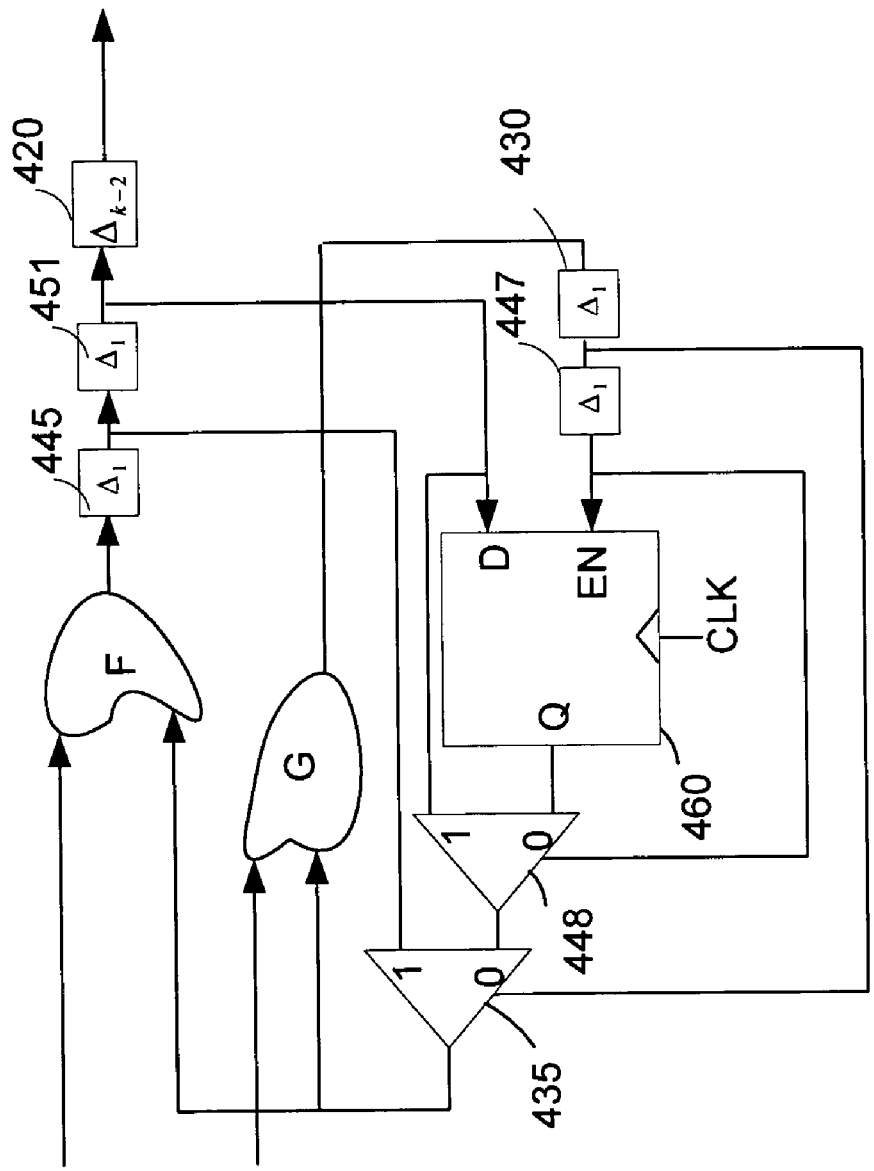

FIG. 4E illustrates a further reduction in the latency delay units by eliminating latency delay unit 452 by moving the 1 input of multiplexer 435 to a node that is between latency delay units 445 and 451, in accordance with the +1 latency rule well known by one having ordinary skill in the art. Thus, a two stage bypass logic has been automatically added to the one stage bypass logic circuit illustrated in FIG. 3B.

Figure 5:
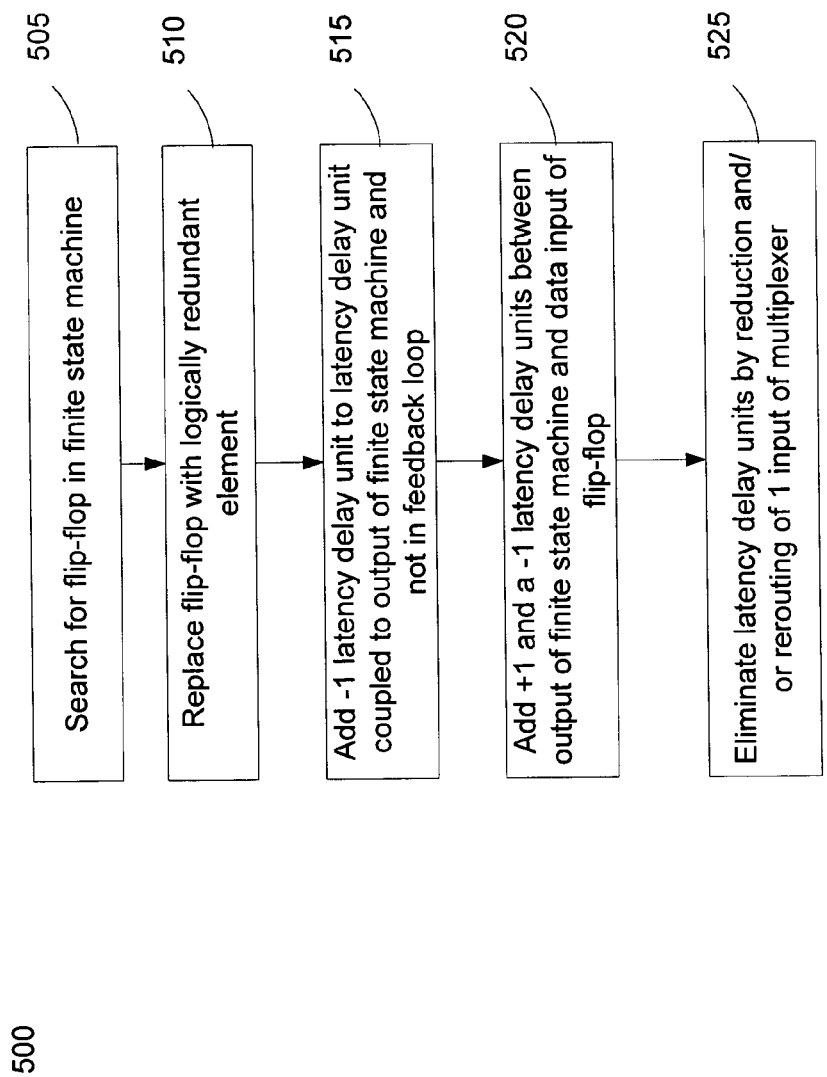
FIG. 5 illustrates a flow diagram to create bypass logic in a digital circuit design according to one embodiment of the invention.

FIG. 5 illustrates a flow diagram to create bypass logic in a digital circuit design according to one embodiment of the invention. As illustrated in flow diagram 500, at 505 a conditional state element that may benefit from having a bypass logic circuit e.g., a flip-flop, a register file, a deterministic memory, etc., in the feedback loop of a finite state machine is found e.g., by computer aided design (CAD) software searching for the terminals comprising the flip-flop.

At 510 the flip-flop is replaced with a logically redundant element 150 of FIG. 1E. At 515, A latency delay unit having a latency delay of −1 unit is added to the latency delay unit coupled to the output of the finite state machine said latency delay unit not in the feedback loop of the finite state machine. At 520, latency delay units having a +1 and a −1 latency delays are added between the output of the finite state machine and the data input of the flip-flop. At 525 the latency delay units are eliminated by reduction and/or rerouting of the 1 input of the multiplexer comprising the logically redundant element. For example, a latency delay unit having a +1 latency delay and a latency delay unit having a −1 latency delay cancel each other in a branch and may be eliminated. So also, rerouting the 1 input of the multiplexer comprising the logically redundant element as described with respect to FIG. 4E may eliminate a latency delay unit.

Figure 6:
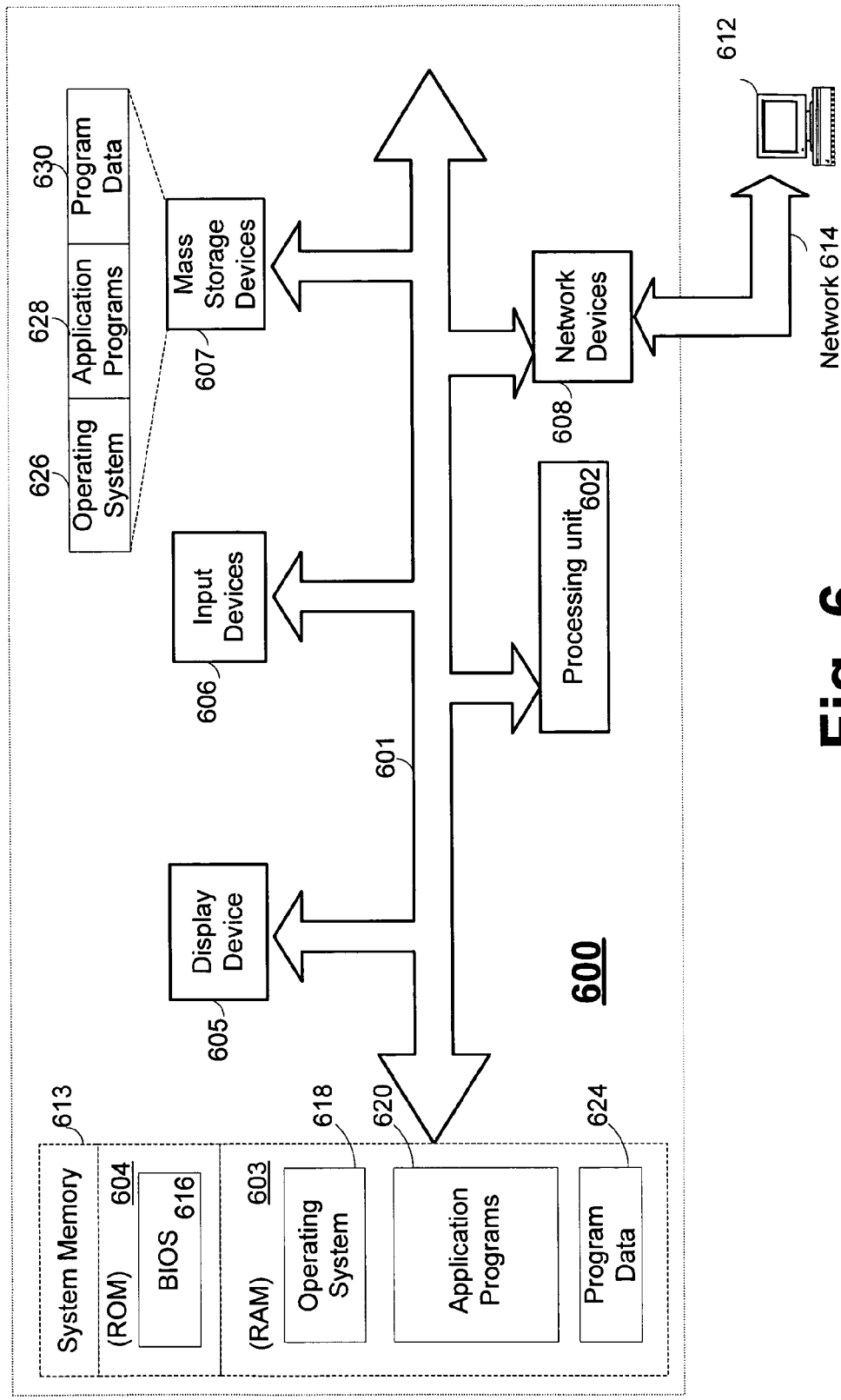
FIG. 6 illustrates an apparatus used to create bypass logic in a digital circuit design according to one embodiment of the invention.

FIG. 6 illustrates an apparatus used to create bypass logic in a digital circuit design according to one embodiment of the invention. In general, the computer system 600 may comprise a processing unit 602 communicatively coupled through a bus 601 to system memory 613, mass storage devices 607, Input devices 606, display device 605 and network devices 608.

Bus 601 may be any of several types of bus structures including a memory bus, a peripheral bus, and a local bus using any of a variety of bus architectures. System memory 613 comprises a read only memory (ROM) 604 and random access memory (RAM) 603. ROM 604 comprises basic input output system (BIOS) 616. BIOS 616 contain the basic routines, e.g., start up routines, that facilitate the transfer of information between elements within computer system 600. RAM 603 includes cache memory and comprises operating system 618, application programs 620, and program data 624. Application programs 620 include the program code for implementing the method described with respect to FIGS. 1-5 above. Program data 624 may include data generated by application programs 620. Mass storage device 607 represents a persistent data storage device, such as a floppy disk drive, fixed disk drive (e.g., magnetic, optical, magneto-optical, or the like), or streaming tape drive. Mass storage device 607 may store application programs 628, operating system 626 for computer system 600, and program data 630. Application programs 628 and program data 630 stored on mass storage devices 607 may include the application programs 620 and program data 624 stored in RAM 603. One embodiment of the invention may be stored entirely as a software product on mass storage device 607. Embodiments of the invention may be represented as a software product stored on a machine-readable medium (also referred to as a computer-accessible medium, a machine-accessible medium, or a processor-accessible medium). The machine-readable medium may be any type of magnetic, optical, or electrical storage medium including a diskette, CD-ROM, memory device (volatile or non-volatile), or similar storage mechanism. The machine-readable medium may contain various sets of instructions, code sequences, configuration information, or other data. Those of ordinary skill in the art will appreciate that other instructions and operations necessary to implement the described invention may also be stored on the machine-readable medium. One embodiment of the invention may be embedded in a hardware product, for example, in a printed circuit board, in a special purpose processor, or in a specifically programmed logic device communicatively coupled to bus 601. Processing unit 602 may be any of a wide variety of general-purpose processors or microprocessors (such as the Pentium® processor family manufactured by Intel® Corporation), a special purpose processor, or a specifically programmed logic device. Processing unit 602 is operable to receive instructions which, when executed by the processing unit cause the processing unit to execute application programs 620.

Display device 605 is coupled to processing unit 602 through bus 601 and provides graphical output for computer system 600. Input devices 606 such as a keyboard or mouse are coupled to bus 601 for communicating information and command selections to processing unit 602. Other input devices may include a microphone, joystick, game pad, scanner, or the like. Also coupled to processing unit 602 through bus 601 is an input/output interface (not shown) which can be used to control and transfer data to electronic devices (printers, other computers, etc.) connected to computer system 600. Computer system 600 includes network devices 608 for connecting computer system 600 to one or more remote devices (e.g., the receiving node) 612 via network 614. Remote device 612 may be another personal computer, a server, a router, a network PC, a wireless device or other common network node and typically includes one or more of the elements described above with respect to computer system 600. Network devices 608, may include a network interface for computer system 600, Ethernet devices, network adapters, phone jacks, modems, and satellite links. It will be apparent to one of ordinary skill in the art that other network devices may also be utilized.

Thus, a method and apparatus to create bypass logic in a digital circuit design has been disclosed. While there has been illustrated and described what are presently considered to be example embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A method comprising:
   adding a bypass logic into a digital circuit design, wherein the adding comprises transforming a conditional state element into a logically redundant element in the digital circuit design, the transforming comprising,
   coupling a first latency delay unit to a data input of the conditional state element;
   coupling a second latency delay unit to an enable input of the conditional state element;
   coupling a first input of a multiplexer to an output of the conditional state element;
   coupling a second input of the multiplexer to the data input of the conditional state element; and
   coupling a select line of the multiplexer to the enable input of the conditional state element; and
   replacing the conditional state element in a finite state machine with the logically redundant element said finite state machine having an F function and a G function, coupled to the logically redundant element.

2. The method of claim 1 wherein coupling a first latency delay unit to a data input of the conditional state element comprises coupling a signal with a delay of one unit into the data input of the conditional state element.

3. The method of claim 1 wherein coupling a second latency delay unit to an enable input of the conditional state element comprises coupling a signal with a delay of one unit into the data input of the conditional state element.

4. The method of claim 1 wherein transforming a conditional state element, into a logically redundant element in a digital circuit design comprises transforming any one of a flip-flop, a register file, and a deterministic memory into a logically redundant element.

5. The method of claim 1 wherein replacing the conditional state element in a finite state machine with the logically redundant element comprises:
   coupling the first latency delay unit to an output of the F function;
   coupling the second latency delay unit to an output of the G function; and
   coupling the multiplexer output to an input of the F function, and to an input of the G function.

6. The method of claim 5 further comprising:
   adding a first −1 latency delay unit to a latency delay unit coupled to the output of the finite state machine, said latency delay unit not in a feedback loop of the finite state machine;
   adding a +1 latency delay unit and a second −1 latency delay unit between the output of the finite state machine and the data input of the conditional state element;
   eliminating latency delay units by any one of reduction of the latency delay units and rerouting of the first input of the multiplexer, to automatically create a bypass logic circuit to the finite state machine.

7. An apparatus comprising:
   a memory to store a circuit design; and
   a processor coupled to the memory through a bus, wherein the processor is to add a bypass logic into the circuit design through a transformation of a conditional statement into a logically redundant element within the circuit design, the processor to perform the following, as part of the transformation identify a conditional state element;
   couple a first latency delay unit to a data input of the conditional state element;
   couple a second latency delay unit to an enable input of the conditional state element;
   couple a first input of a multiplexer to an output of the conditional state element;
   couple a second input of the multiplexer to the data input of the conditional state element;
   couple a select line of the multiplexer to the enable input of the conditional state element; and
   replace the conditional state element in a finite state machine said finite state machine having an F function and a G function coupled to the logically redundant element.

8. The apparatus of claim 7 wherein the conditional state element further comprises at least one of a flip-flop, a register file, and a deterministic memory.

9. The apparatus of claim 7 wherein the processor to couple a first latency delay unit to a data input of the conditional state element comprises the processor to couple a signal with a delay of one unit into the data input of the conditional state element.

10. The apparatus of claim 7 wherein the processor to couple a second latency delay unit to an enable input of the conditional state element comprises the processor to couple a signal with a delay of one unit into the data input of the conditional state element.

11. The apparatus of claim 7 wherein the processor to replace the conditional state element in a finite state machine with the logically redundant element comprises the processor to:
- couple the first latency delay unit to an output of the F function;
- couple the second latency delay unit to an output of the G function; and
- couple the multiplexer output to an input of the F function, and to an input of the G function.

12. The apparatus of claim 11 further comprising the processor to
- add a first −1 latency delay unit to a latency delay unit coupled to the output of the finite state machine, said latency delay unit not in a feedback loop of the finite state machine;
- add a +1 latency delay unit and a second −1 latency delay unit between the output of the finite state machine and the data input of the conditional state element;
- eliminate latency delay units by any one of reduction of the latency delay units and rerouting of the first input of the multiplexer, to automatically create a bypass logic circuit to the finite state machine.

13. An article of manufacture that provides instructions, which when executed by a machine, cause said machine to perform operations comprising:
- adding a bypass logic into a digital circuit design, wherein adding comprises transforming a conditional state element into a logically redundant element in the digital circuit design, the transforming comprising,
- identifying the conditional state element;
- coupling a first latency delay unit to a data input of the conditional state element;
- coupling a second latency delay unit to an enable input of the conditional state element;
- coupling a first input of a multiplexer to an output of the conditional state element;
- coupling a second input of the multiplexer to the data input of the conditional state element; and
- coupling a select line of the multiplexer to the enable input of the conditional state element; and
- replacing the conditional state element in a finite state machine with the logically redundant element said finite state machine having an F function and a G function, coupled to the logically redundant element.

14. The article of manufacture of claim 13 wherein said instructions for coupling a first latency delay unit to a data input of the conditional state element comprises further instructions for coupling a signal with a delay of one unit into the data input of the conditional state element.

15. The article of manufacture of claim 13 wherein said instructions for coupling a second latency delay unit to an enable input of the conditional state element comprises further instructions for coupling a signal with a delay of one unit into the data input of the conditional state element.

16. The article of manufacture of claim 13 wherein said instructions for replacing the conditional state element in a finite state machine with the logically redundant element comprises further instructions for:
- coupling the first latency delay unit to an output of the F function;
- coupling the second latency delay unit to an output of the G function; and
- coupling the multiplexer output to an input of the F function, and to an input of the G function.

17. The article of manufacture of claim 16 comprising further instructions for
- adding a first −1 latency delay unit to a latency delay unit coupled to the output of the finite state machine, said latency delay unit not in a feedback loop of the finite state machine;
- adding a +1 latency delay unit and a second −1 latency delay unit between the output of the finite state machine and the data input of the conditional state element;
- eliminating latency delay units by any one of reduction of the latency delay units and rerouting of the first input of the multiplexer, to automatically create a bypass logic circuit to the finite state machine.

* * * * *